US008456269B2

(12) United States Patent
Sohn et al.

(10) Patent No.: US 8,456,269 B2
(45) Date of Patent: Jun. 4, 2013

(54) COIL BOBBIN FOR SUPERCONDUCTING MAGNETIC ENERGY STORAGE

(75) Inventors: Myunghwan Sohn, Changwon-si (KR); Joonhan Bae, Changwon-si (KR); Kichul Seong, Changwon-si (KR); Kideok Sim, Changwon-si (KR); Haejong Kim, Changwon-si (KR); Homin Kim, Changwon-si (KR)

(73) Assignee: Korea Electrotechnology Research Institute (KR)

( * ) Notice: Subject to any disclaimer, the term of this patent is extended or adjusted under 35 U.S.C. 154(b) by 0 days.

(21) Appl. No.: 13/278,304

(22) Filed: Oct. 21, 2011

(65) Prior Publication Data

US 2012/0032770 A1 Feb. 9, 2012

(30) Foreign Application Priority Data

Jan. 13, 2010 (KR) ........................ 10-2010-0003046
Dec. 1, 2010 (WO) ................ PCT/KR2010/008406

(51) Int. Cl.
*H01F 27/30* (2006.01)
*H01F 1/00* (2006.01)
*H01L 39/24* (2006.01)

(52) U.S. Cl.
USPC ...... 336/198; 336/208; 336/DIG. 1; 336/185; 335/216

(58) Field of Classification Search
USPC .................... 336/198, 208, 229, DIG. 1, 185, 336/199; 335/216; 505/705, 237, 238, 879, 505/880, 221, 924
See application file for complete search history.

(56) References Cited

U.S. PATENT DOCUMENTS

| | | | | |
|---|---|---|---|---|
| 5,818,226 | A * | 10/1998 | Aizawa | 324/258 |
| 7,301,425 | B2 * | 11/2007 | Ko et al. | 335/216 |
| 7,495,539 | B2 * | 2/2009 | Sundaram | 336/208 |
| 2006/0181387 | A1 * | 8/2006 | Myers et al. | 336/208 |
| 2007/0171022 | A1 * | 7/2007 | Marui et al. | 336/200 |

FOREIGN PATENT DOCUMENTS

JP 60-001812 A * 1/1985

* cited by examiner

*Primary Examiner* — Mohamad Musleh
*Assistant Examiner* — Mangtin Lian
(74) *Attorney, Agent, or Firm* — Park & Associates IP Law, P.C.

(57) ABSTRACT

Disclosed herein is a coil bobbin for a superconducting magnetic energy storage. The coil bobbin includes coil bobbin frames, superconducting coils, first support plates, second support plates and a center frame. The coil bobbin frames are provided in such a way as to face each other. The superconducting coils are wound around the respective coil bobbin frames. The first support plates are provided on surfaces of the respective coil bobbin frames that are on faces that are opposite to the surfaces between the coil bobbin frames that face each other. The second support plates are provided on the respective facing surfaces of the coil bobbin frames. The center frame is disposed between the second support plates and has an annular plate shape having a thickness that is gradually reduced towards a center of the toroidal arrangement.

18 Claims, 9 Drawing Sheets

COIL BOBBIN FOR SUPERCONDUCTING MAGNETIC ENERGY STORAGE

REFERENCE TO RELATED APPLICATIONS

This is a continuation of pending International Patent Application PCT/KR2010/008406, filed on Dec. 1, 2010, which designates the United States and claims priority of Korean Patent Application No. 10-2010-0003046, filed on Jan. 13, 2010, the entire contents of which are incorporated herein by reference.

FIELD OF THE INVENTION

The present invention relates to a coil bobbin for a superconducting magnetic energy storage having a plurality of coil bobbins to allow a superconducting coil to be wound in a toroidal arrangement.

BACKGROUND OF THE INVENTION

Recently, with the advances society has made in technology and the expansion of information and communication equipment, computation equipment, online service equipment, automated production line and precise control equipment, there has been a lot of research into superconducting magnetic energy storage (SMESs) aiming to provide high-quality power to sensitive and important loads placed on equipment. There is a variety of superconducting magnetic energy storage, including small superconducting magnetic energy storage which is used to control the quality of power, and large superconducting magnetic energy storage which are used to equalize a load. Recently, small superconducting magnetic energy storage in several MJ class for purposes of controlling the power quality of sensitive loads has been commercialized for industrial and military use, and their effect has been proven.

Such a superconducting magnetic energy storage includes a superconducting magnet comprising some superconducting coils, a cryostat which contains the superconducting magnet, a pair of current leads which leads two terminals of the superconducting magnet to the outside of the cryostat, and a power converter which supplies power from an electric power system after converting the power.

In the conventional art, a thin tape-shaped superconducting coil wire is wound up in a pancake shape to form a superconducting coil. Two superconducting coils are used in pair in a double pancake shape. A superconducting magnet is formed by placing double-pancake-shaped superconducting coils one on top of another. In the case of the superconducting coil, depending on the magnitude of a vertical magnetic field perpendicular to a surface, in detail, a large surface, of the pancake-shaped superconducting coil, the characteristics of the critical current become vastly different. As the magnitude of the vertical magnetic field increases, the critical current is reduced, resulting in the problem of the operating current of the superconducting magnet eventually being reduced.

In an effort to overcome the above problem, a method was proposed, in which, instead of being placed one on top of another, the superconducting coils are arranged in a toroidal structure to reduce the vertical magnetic field of the superconducting coils when storing energy in the superconducting magnet.

However, in this conventional method, because adjacent superconducting coils form a double-pancake shape in which they are attached parallel to each other, if these superconducting coils are arranged in a toroidal structure, the area of conductive portions that are displaced from the outermost circumferential surface of the toroidal structure is increased. That is, there is the problem of an increase in the vertical magnetic field on the conductive portions that are displaced from the curved surface of the toroidal structure.

Particularly, in the case of a superconducting coil wire with a width of 4 mm which is widely used, the effect of the toroidal structure that reduces the magnitude of the vertical magnetic field is markedly reduced, because the area of the conductive portions that are displaced from the outermost circumferential surface of the toroidal structure increases, as the width of the superconducting coil wire increases.

SUMMARY OF THE INVENTION

Accordingly, the present invention has been made keeping in mind the above problems occurring in the prior art, and an object of the present invention is to provide a coil bobbin for a superconducting magnetic energy storage which can reduce the magnitude of a vertical magnetic field generated by the superconducting coil.

The above object of the invention is not intended as a definition of the limits of the invention. The above and other objects and features of the invention will become apparent from the following description of embodiments with reference to the accompanying drawings.

In order to accomplish the above object, the present invention provides a coil bobbin for a superconducting magnetic energy storage having a plurality of coil bobbins to allow a superconducting coil to be wound in a toroidal arrangement, the coil bobbin including: a pair of coil bobbin frames provided in such a way as to face each other, each of the coil bobbin frames having an annular plate shape; superconducting coils wound around the respective coil bobbin frames, each of the superconducting coils forming a pancake shape; first support plates provided on surfaces of the respective coil bobbin frames, the surfaces being opposite to surfaces facing each other between the coil bobbin frames, first support plates supporting the coil bobbin frames; second support plates provided on the respective facing surfaces of the coil bobbin frames, the second support plates supporting the coil bobbin frames; and a center frame disposed between the second support plates, the center frame having an annular plate shape that is gradually reduced in thickness towards a center of the toroidal arrangement.

Each of the coil bobbin frames may have an opening in a portion of the annular plate shape.

Each of the coil bobbin frames may be made of any one among GFRP (Glass Fiber Reinforced Plastic), an anodized aluminum and a combination of a GFRP substance and an anodized aluminum substance that are adhered to each other.

Each of the first support plates may comprise two plates with a gap between the two plates, or a plate having a linear slot and a curved slot therein.

Each of the second support plates may have a slot through which the corresponding superconducting coil is drawn in or out.

The first support plates, the second support plates and the center frame may be made of GFRP or anodized aluminum.

The coil bobbin may further include insulation tape or paper provided on surfaces of the first and second support plates that are in contact with the superconducting coils.

The coil bobbin may further include conductive metal bars provided between the first support plates and the second support plates on respective upper and lower ends of the first and second support plates. The conductive metal bars are used for conduction-cooling of the corresponding superconducting coils.

Each of the conductive metal bars may have a first end curved to correspond to a circumferential outer surface of the superconducting coil, and a second end protruding outwards from the first support plate and the second support plate, the second end forming a flat surface, wherein the conductive metal bar has a stepped structure in such a way that a thickness of a portion thereof protruding from the upper and lower plates is greater than a thickness of a portion thereof between the upper and lower plates.

The first support plates and the second support plates may extend upwards and downwards to be coupled to the corresponding conductive metal bars.

Each of the conductive metal bars may have a screw hole allowing the connective metal bar to be coupled to the corresponding first and second support plates, the screw hole comprising a vertically-elongated hole.

Each of the conductive metal bars may be made of anodized aluminum.

The coil bobbin may further include wedges respectively provided above and below the center frame.

The coil bobbin may further include a joint support provided on an outer surface of each of the first support plates, the joint support guiding the corresponding superconducting coil to an outside and supporting the superconducting coil.

The joint support may have a screw hole allowing the joint support to be coupled to the first support plate, the screw hole having an elongated shape.

A coil bobbin for a superconducting magnetic energy storage according to the present invention can reduce the magnitude of a vertical magnetic field generated by the superconducting coil.

Furthermore, the present invention can reduce an eddy current loss which is caused when the superconducting magnetic energy storage is operated.

In addition, the present invention can increase the efficiency of cooling superconducting coils.

Details implying the above objects, solutions and advantages of the present invention will be described in the following embodiments and drawings. The advantages and features of the present invention and methods to achieve these will be more clearly understood from the following detailed description taken in conjunction with the accompanying drawings. Reference should be made to the drawings, in which the same reference numerals are used throughout the different drawings to designate the same or similar components.

DESCRIPTION OF THE REFERENCE NUMERALS IN THE DRAWINGS

Figure 1:
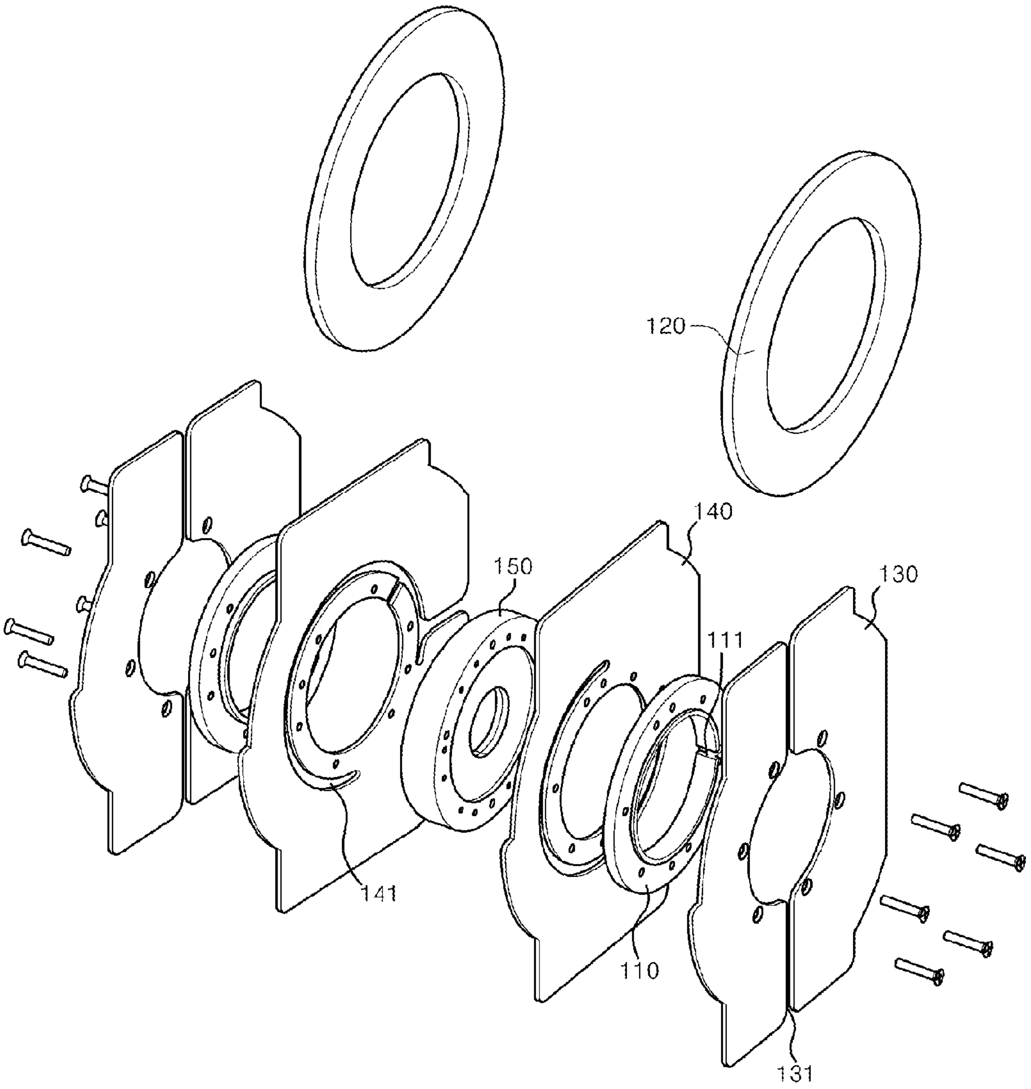
FIG. 1 is an exploded perspective view of a coil bobbin for a superconducting magnetic energy storage, according to an embodiment of the present invention.

100: coil bobbin
110: coil bobbin frame
111: opening
120: superconducting coil
130: first support plate
131: gap
132: linear slot
133: curved slot
140: second support plate
141: slot
150: center frame
160: conductive metal bar
161: first end of conductive metal bar
162: second end of conductive metal bar
170: wedge
180: joint support
181: elongated screw hole
800: superconducting magnetic energy storage

DETAILED DESCRIPTION OF THE INVENTION

Hereinafter, the present invention will be described in detail with reference to the attached drawings.

Figure 2:
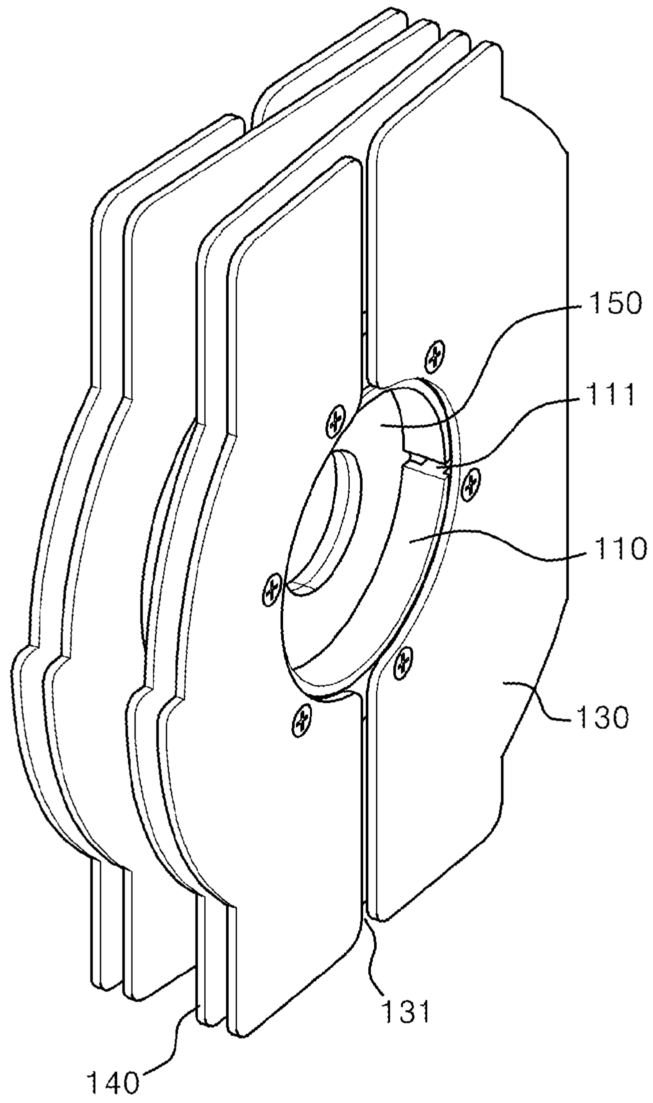
FIG. 2 is a perspective view of the assembled coil bobbin for the superconducting magnetic energy storage according to the embodiment of the present invention.

FIGS. 1 and 2 are views illustrating a coil bobbin for a superconducting magnetic energy storage, according to an embodiment of the present invention. In detail, FIG. 1 is an exploded perspective view of the coil bobbin for the superconducting magnetic energy storage, according to the embodiment of the present invention. FIG. 2 is a perspective view of the assembled coil bobbin for the superconducting magnetic energy storage according to the embodiment of the present invention.

As shown in FIGS. 1 and 2, the coil bobbin for the superconducting magnetic energy storage according to the embodiment of the present invention includes coil bobbin frames 110, superconducting coils 120, first support plates 130, second support plates 140 and a center frame 150.

The coil bobbin frames 110 have annular plate shapes, around which the superconducting coils 120 are wound. In the embodiment, the two coil bobbin frames 110 are disposed in such a way as to face each other. Each coil bobbin frame 110 has a partially open structure which has an opening 111 in a portion of the annular plate so that eddy current can be reduced during charge or discharge of the superconducting magnetic energy storage. This is the same principle as that of the structure of a current transformer in which a gap is formed in an iron core to reduce the eddy current loss.

Preferably, the coil bobbin frame 110 is made of any one among GFRP (Glass Fiber Reinforced Plastic), anodized aluminum and a combination of a GFRP substance and an anodized aluminum substance which are adhered to each other. The GFRP and the anodized aluminum are insulating materials. Due to this, the coil bobbin frame 110 can be insulated from the superconducting coil 120.

Here, because the GFRP is plastic, there is an effect of reducing the eddy current loss when charge or discharge of the superconducting magnetic energy storage. On the other hand, the anodized aluminum is metal having high thermal conductivity, so that the conductive cooling efficiency of the superconducting coil 120 can increase. The combination of GFRP and anodized aluminum can have the above two characteristics. The combination structure is configured in such a way that an inner annular plate is made of GFRP, an outer annular plate is made of anodized aluminum, and the two annular plates are adhered to each other.

The superconducting coils 120 are wound around the respective coil bobbin frames 110 to have a pancake shape. Each superconducting coil 120 is formed by winding up a thin tape-shaped superconducting wire whose width is about 4 mm. To embody the intended purpose, a high temperature superconducting coil may be used as the superconducting coil 120, or alternatively, a low temperature superconducting coil may be used as it. In the embodiment, the two pancake-shaped superconducting coils 120 are provided around the respective coil bobbin frames 110.

Figure 9:
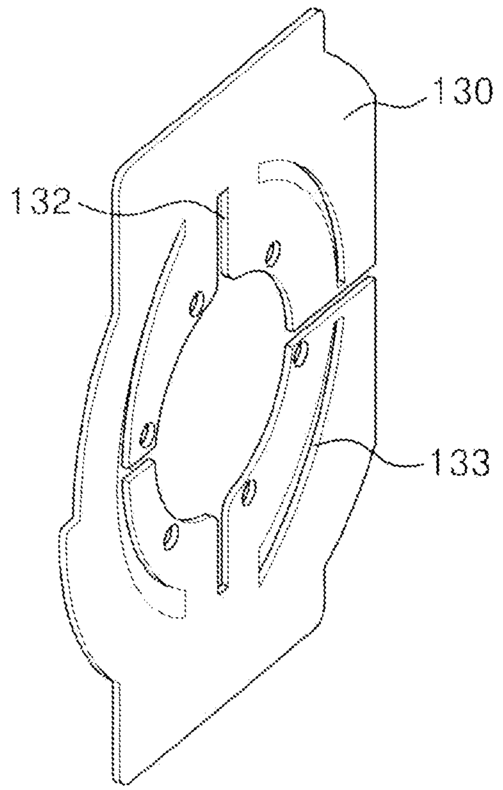
FIG. 9 is a perspective view of a first support plate, another embodiment of the present invention.

The first support plates 130 are provided on the surfaces of the respective coil bobbin frames 110 that are on the faces that are the opposite side of the surfaces of the coil bobbin frames 110 that face each other. The first support plates 130 support the coil bobbin frames 110. That is, with regard to the single coil bobbin, the first support plates 130 form the outermost surfaces of the coil bobbin. Each first support plate 130 comprises two plates with a gap 131 formed therebetween. Alternatively, a linear slot 132 and a curved slot 133 may be formed in the first support plate 130. In other words, the first support plate 130 may comprise two separate plates with the gap 131 formed therebetween. In another embodiment (refer to FIG. 9), the first support plate 130 may comprise an integrated plate having the linear slot 132 and the curved slot 133 therein. The gap 131, or the linear slot 132 and the curved slot 133 function to reduce eddy current during charging or discharging of the superconducting magnetic energy storage, in the same manner as that of the opening 111 of the coil bobbin frame 110. The first support plate 130 is made of either GFRP or anodized aluminum as necessary. In the case where the first support plate 130 is made of GFRP, the first support plate 130 has an integrated structure which has no gap 131.

The second support plates 140 are provided on the surfaces of the respective coil bobbin frames 110 that face each other. The second support plates 140 also support the coil bobbin frames 110. Further, the second support plates 140 are disposed between the facing surfaces of the coil bobbin frames 110 to function as a spacer with respect to the two superconducting coils 120.

Figure 3:
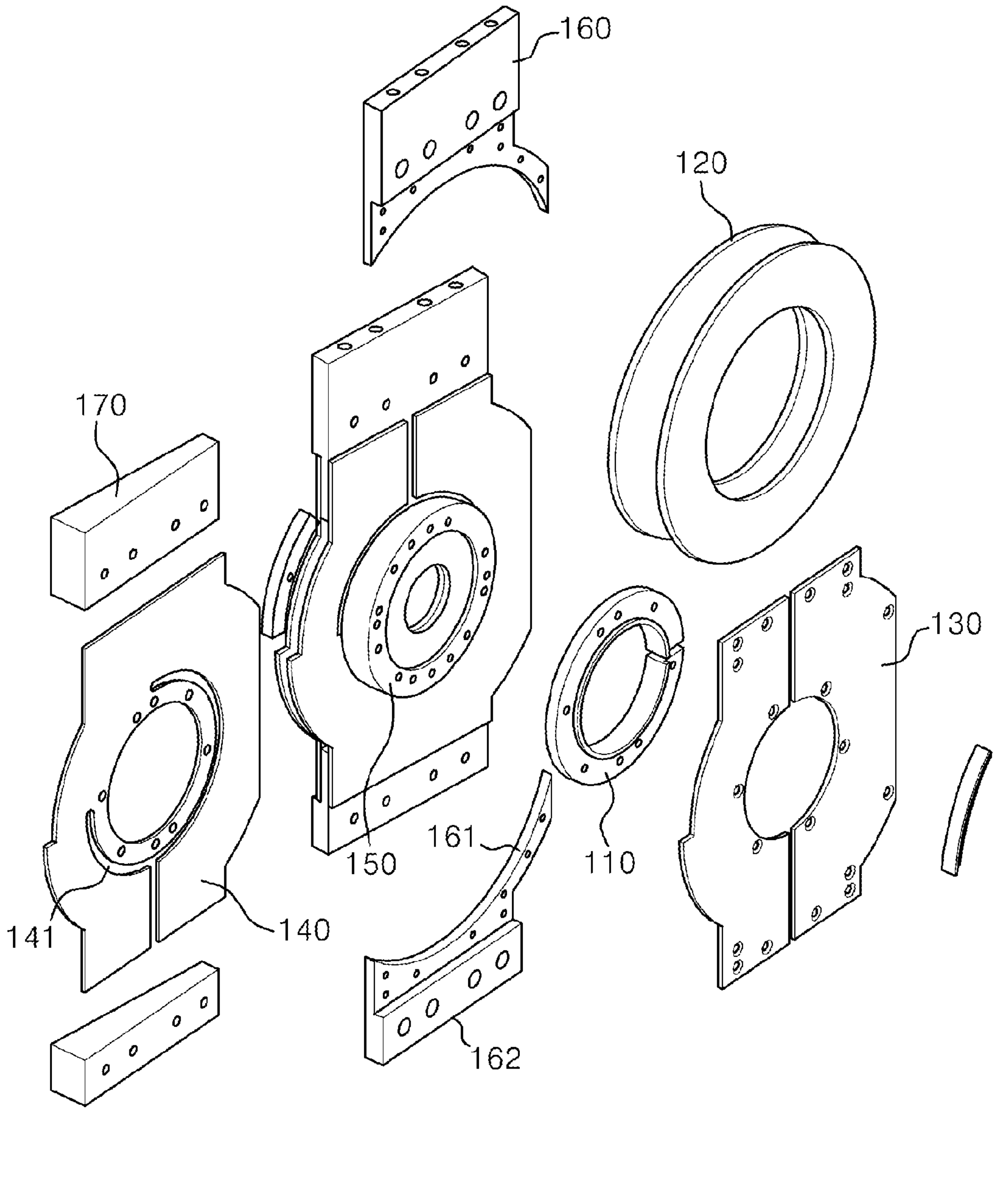
FIG. 3 is an exploded perspective view of a coil bobbin for a superconducting magnetic energy storage having conductive metal bars according to another embodiment of the present invention.

In addition, each second support plate 140 has a slot 141 through which the corresponding superconducting coil 120 is drawn in or extracted. In other words, a superconducting wire is drawn towards the coil bobbin frame 110 through the slot 141 and wound around the coil bobbin frame 110 to form the superconducting coil 120. The superconducting wire is extracted from the coil bobbin frame 110 through the slot 141 and connected to the superconducting coil 120 that is provided around the opposite coil bobbin frame 110. The slot 141 of the second support plate 140 also functions to reduce eddy current during charging or discharging of the superconducting magnetic energy storage, in the same manner as that of the opening 111 of the coil bobbin frame 110. Moreover, as shown in FIGS. 1 and 3 illustrating different shapes of the slot 141, the shape of the slot 141 may be changed, in light of such considerations as convenience when drawing it in and extracting it, and the reduction in eddy current. The second support plate 140 is also made of either GFRP or anodized aluminum as necessary.

The center frame 150 is disposed between the second support plates 140 and has an annular plate shape. The thickness of the center frame 150 is gradually reduced from the outside to the center of the toroidal structure. Due to this shape of the center frame 150, unlike the conventional technique which has a double pancake shape formed by attaching two pancake-shaped superconducting coils to each other in parallel, in the coil bobbin according to the embodiment of the present invention, the superconducting coils each of which has a single pancake shape are arranged to have a toroidal structure. In detail, the two pancake-shaped superconducting coils form an angled double pancake shape wherein the two superconducting coils gradually approach each other from the outside to the center of the toroidal structure. In this case, because the area of conductive portions that are displaced from the outermost circumferential surface of the toroidal structure is reduced, the surfaces of the wound superconducting coils are more similar to the curved surface of the toroidal structure. Therefore, the magnitude of a vertical magnetic field formed by the superconducting coils can be reduced. Preferably, the center frame 150 is also made of either GFRP or anodized aluminum as necessary.

Meanwhile, the coil bobbin for the superconducting magnetic energy storage according to the embodiment of the present invention may further include insulating tape (not shown) or insulating paper (partially shown in the photos of FIG. 7) which is provided on the surfaces of the first and second support plates 130 and 140 that are in contact with the superconducting coils, thus further increasing the degree with which the first and second support plates 130 and 140 are insulated from the superconducting coil 120.

Figure 4:
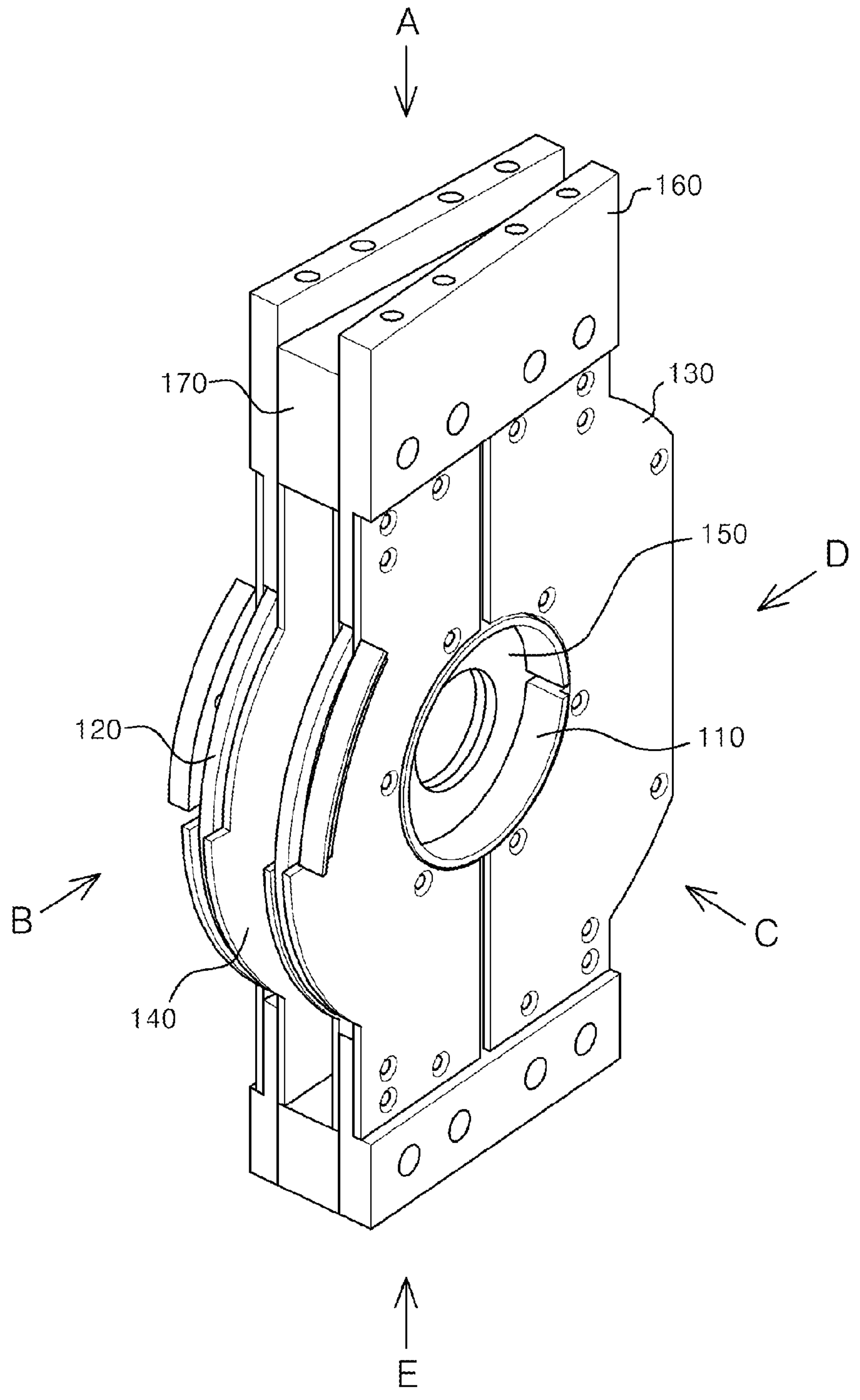
FIG. 4 is a perspective view of the assembled coil bobbin having the conductive metal bars according to the embodiment of the present invention.
Figure 5:
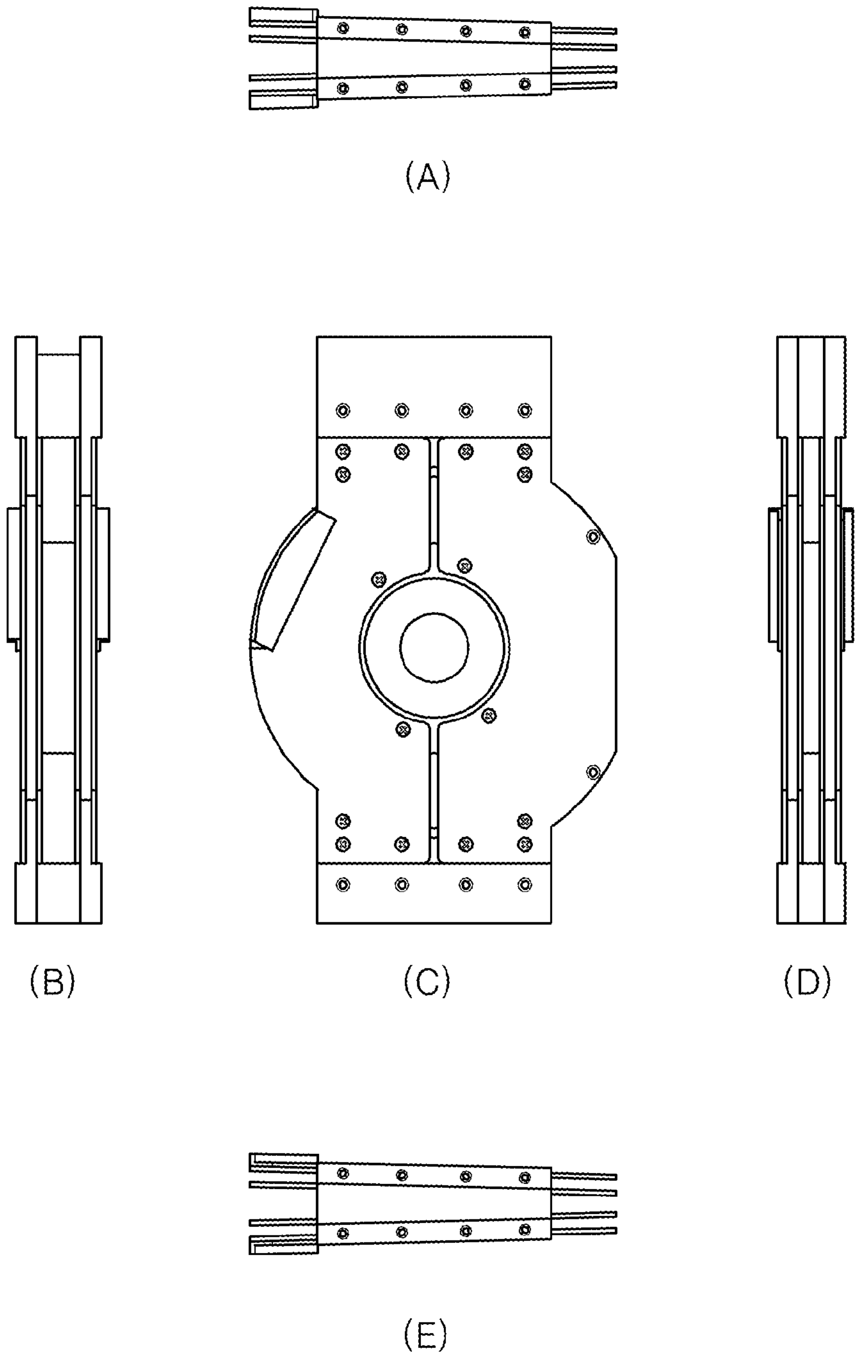
FIG. 5 is of views showing the shapes of the coil bobbin of FIG. 4 from the directions indicated by the arrows A, B, C, D and E.

FIGS. 3 through 5 illustrate a coil bobbin for a superconducting magnetic energy storage having conductive metal bars according to another embodiment of the present invention. In detail, FIG. 3 is an exploded perspective view of the coil bobbin having the conductive metal bars according to the embodiment of the present invention. FIG. 4 is a perspective view of the assembled coil bobbin having the conductive metal bars according to the embodiment of the present invention. FIG. 5 is of views showing the shapes of the coil bobbin of FIG. 4 from the directions indicated by the arrows A, B, C, D and E.

As shown in FIGS. 3 through 5, the coil bobbin according to this embodiment of the present invention further includes conductive metal bars 160 which are provided between first support plates 130 and second support plates 140 on respective upper and lower ends of the first and second support plates 140. The conductive metal bars 160 are used for conduction-cooling of corresponding superconducting coils 120.

Each conductive metal bar 160 has a first end 161 which is curved to correspond to the circumferential outer surface of the superconducting coil 120 to enhance the efficiency of conduction-cooling the superconducting coil 120. A second end 162 of the conductive metal bar 160 protrudes outwards from the space between the first support plate 130 and the second support plate 140 and forms a flat surface. Thus, the conductive metal bar 160 functions to support the corresponding coil bobbin. Further, the structure of the conductive metal bar 160 is a stepped structure wherein a thickness a of the protruding portion is greater than a thickness b of the portion between the upper and lower plates so that the volume of the protruding portion increases to enhance the conduction-cooling efficiency. In addition, the force of coupling the first support plate 130 to the second support plate 140 can be enhanced.

Furthermore, to make the coupling between the conductive metal bar 160 and the first and second support plates 130 and 140 more sturdy, the upper and lower ends of the first and second support plates 130 and 140 extend upwards and downwards. In other words, each of the first and second support plates 130 and 140 has a circular plate shape that has wing plates on the upper and lower ends thereof.

The conductive metal bar 160 is preferably made of anodized aluminum which is a metal that is able to be insulated from the superconducting coil 120 and has high thermal conductivity.

Meanwhile, although it is not shown in FIGS. 3 through 5, screw holes which are formed in the conductive metal bar 160 to couple it to the first support plate 130 and the second support plate 140 may comprise an elongated hole that extends in the vertical direction. In this case, the installation heights of the coil bobbins on the support surface can be easily matched with each other. Thus, the area of conductive portions that are displaced from the toroidal structure can be reduced, so that the surfaces of the wound superconducting coils can be more similar to the curved surface of the toroidal structure. Thereby, the magnitude of a vertical magnetic field formed by the superconducting coils can be further reduced.

Moreover, the coil bobbin for the superconducting magnetic energy storage according to this embodiment of the present invention further includes wedges 170 which are disposed above and below a center frame 150. The wedges 170 support the entire coil bobbin above and below the center frame 150 to stably maintain the structure such that the two pancake-shaped superconducting coils gradually approach each other from the outside to the center of the toroidal structure. Each wedge 170 is also made of either GFRP or anodized aluminum.

Figure 6:
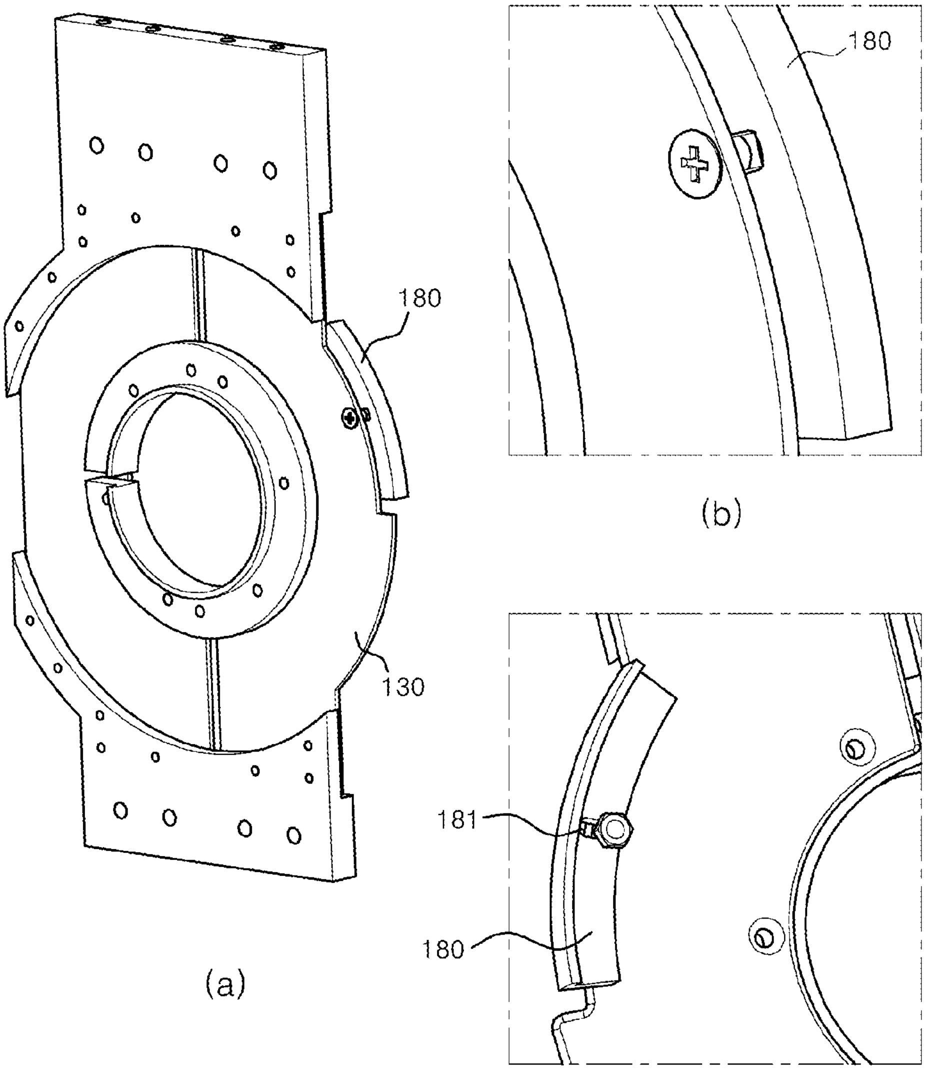
FIG. 6 is of views illustrating a joint support according to another embodiment the present invention.

FIG. 6 is of views illustrating a joint support according to another embodiment of the present invention.

As shown in FIG. 6, a coil bobbin for a superconducting magnetic energy storage according to this embodiment of the present invention further includes the joint support 180 which is provided on the outer surface of each first support plate 130 to support a superconducting coil 120 and guide it to the outside of the coil bobbin. Due to this structure, superconducting coils 120 can be easily connected to each other between adjacent two coil bobbins. The joint support 180 is made of GFRP or anodized aluminum, which is an insulating material, so as to support the corresponding superconducting coil 120.

Figure 7:
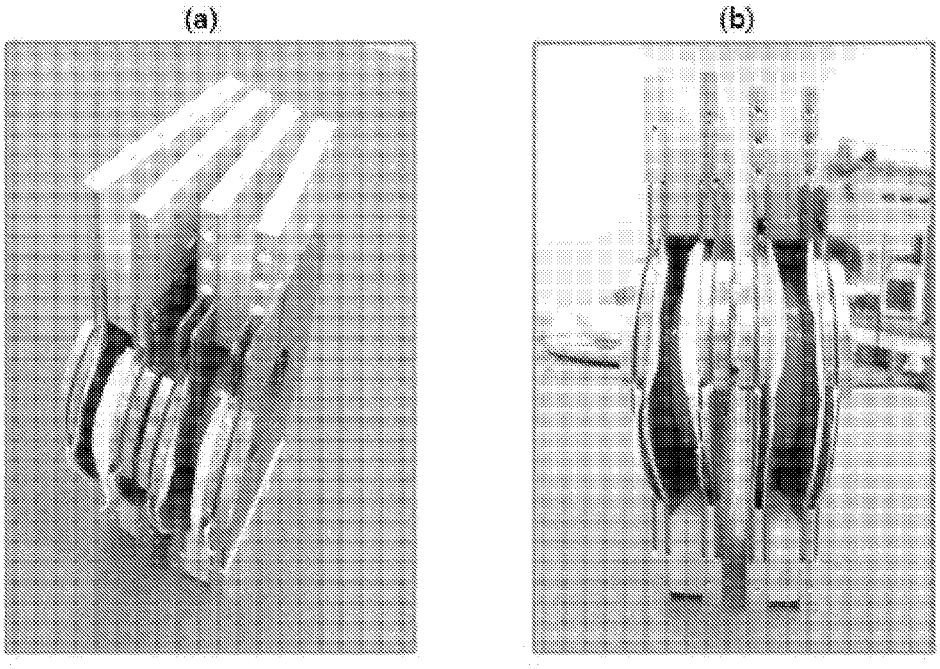
FIG. 7 is of sample photos showing an embodiment of the assembly of two coil bobbins according to the present invention.
Figure 8:
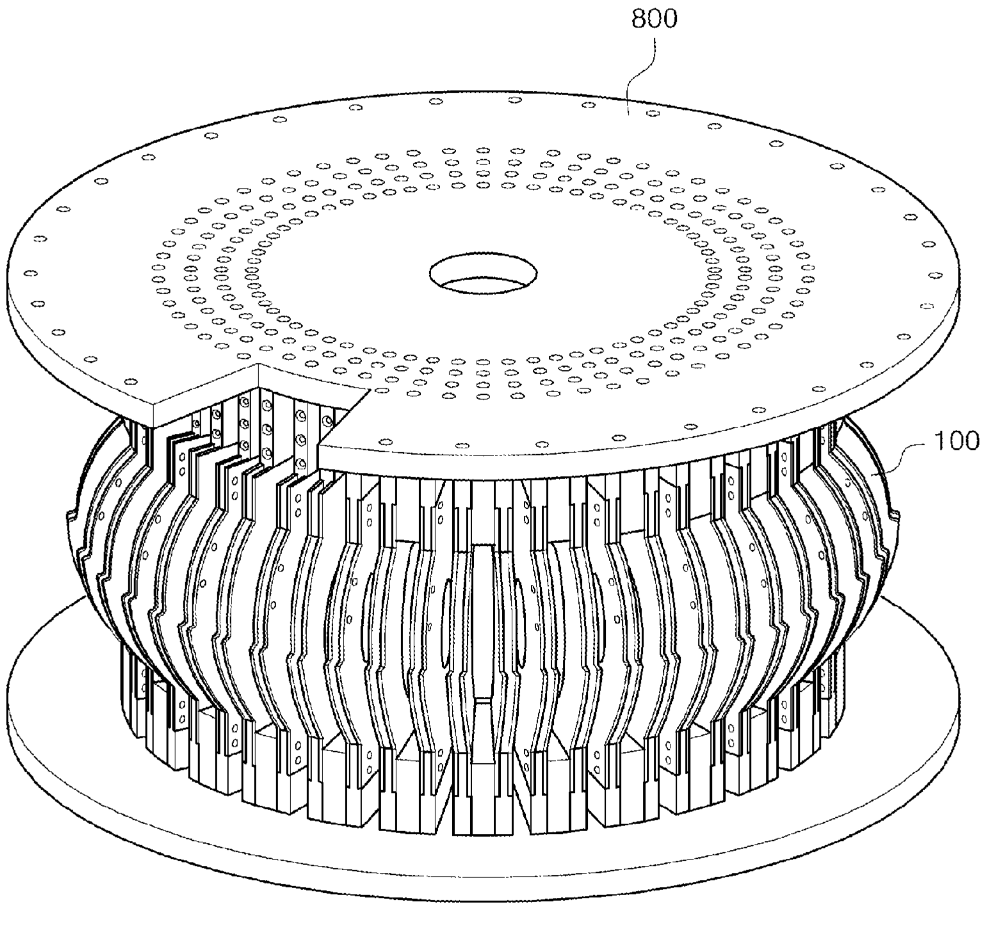
FIG. 8 is a view showing an embodiment of a toroidal arrangement of a plurality of coil bobbins according to the present invention.

Furthermore, the joint support 180 has a screw hole 181 through which the joint support 180 is coupled to the first support plate 130. The screw hole 181 has an elongated shape so that the position at which the joint support 180 is coupled to the first support plate 130 can be adjusted. Thereby, the positions of the joint supports 180 between the coil bobbins can be matched with each other. Moreover, in FIG. 6, although the joint support 180 is illustrated as having the single elongated screw hole 181, two or more screw holes may be formed as necessary. In addition, although the joint support 180 is illustrated in FIG. 6 as being disposed on a comparatively upper portion of the first support plate 130, it may be disposed on a lower or medial portion of the first support plate 130, as necessary.

mom FIGS. 7 and 8 are views showing an embodiment of an arrangement of a plurality of coil bobbins for superconducting magnetic energy storage. In detail, FIG. 7 is of sample photos showing an embodiment of the assembly of two coil bobbins according to the present invention. FIG. 8 is a view showing an embodiment of a toroidal arrangement of a plurality of coil bobbins according to the present invention.

Each of the coil bobbins 100 for the superconducting magnetic energy storage of FIGS. 7 and 8 has the structure illustrated in FIGS. 1 through 6. The coil bobbins 100 are connected to each other to form a toroidal structure and are disposed in the superconducting magnetic energy storage (800 in the drawing, showing only a portion of the entire superconducting magnetic energy storage that has the coil bobbins). Therefore, the coil bobbins 100 for the superconducting magnetic energy storage according to the present invention can reduce the magnitude of a vertical magnetic field formed by the superconducting coils. Furthermore, the present invention can not only enhance the efficiency of cooling the superconducting coil but also reduce eddy current which is generated when the superconducting magnetic energy storage is operated.

As described above, those skilled in the art will be able to easily understand that the above-mentioned structure of the present invention can be modified in other various embodiments without departing from the scope and essential characteristics of the invention.

Therefore, the above-stated embodiments must be regarded as being only for illustrative purposes which are not intended to limit the present invention. The scope of the present invention must be defined by the accompanying claims other than the embodiments. In addition, any and all modifications, variations or equivalent arrangements which may occur to those skilled in the art should be considered to be within the scope of the invention.

What is claimed is:

1. A coil bobbin for a superconducting magnetic energy storage having a plurality of coil bobbins to allow a superconducting coil to be wound in a toroidal arrangement, the coil bobbin comprising:

- a pair of coil bobbin frames provided in such a way as to face each other, each of the coil bobbin frames having an annular plate shape;
- superconducting coils wound around the respective coil bobbin frames, each of the superconducting coils forming a pancake shape;
- first support plates provided on surfaces of the respective coil bobbin frames, the surfaces being opposite to surfaces facing each other between the coil bobbin frames, first support plates supporting the coil bobbin frames;
- second support plates provided on the respective facing surfaces of the coil bobbin frames, the second support plates supporting the coil bobbin frames; and
- a center frame disposed between the second support plates, the center frame having an annular plate shape that is gradually reduced in thickness towards a center of the toroidal arrangement.

2. The coil bobbin for the superconducting magnetic energy storage according to claim 1, wherein each of the coil bobbin frames has an opening in a portion of the annular plate shape.

3. The coil bobbin for the superconducting magnetic energy storage according to claim 1, wherein each of the coil bobbin frames is made of any one among GFRP (Glass Fiber Reinforced Plastic), an anodized aluminum and a combination of a GFRP substance and an anodized aluminum substance that are adhered to each other.

4. The coil bobbin for the superconducting magnetic energy storage according to claim 1, wherein each of the first support plates comprises two plates with a gap between the two plates, or a plate having a linear slot and a curved slot therein.

5. The coil bobbin for the superconducting magnetic energy storage according to claim 1, wherein each of the second support plates has a slot through which the corresponding superconducting coil is drawn in or out.

6. The coil bobbin for the superconducting magnetic energy storage according to claim 1, wherein the first support plates, the second support plates and the center frame are made of GFRP or anodized aluminum.

7. The coil bobbin for the superconducting magnetic energy storage according to claim 1, further comprising:

insulation tape or paper provided on surfaces of the first and second support plates that are in contact with the superconducting coils.

8. The coil bobbin for the superconducting magnetic energy storage according to claim 1, further comprising:

conductive metal bars provided between the first support plates and the second support plates on respective upper and lower ends of the first and second support plates, the conductive metal bars conduction-cooling the corresponding superconducting coils.

9. The coil bobbin for the superconducting magnetic energy storage according to claim 8, wherein each of the conductive metal bars has: a first end curved to correspond to a circumferential outer surface of the superconducting coil; and a second end protruding outwards from the first support plate and the second support plate, the second end forming a flat surface, wherein the conductive metal bar has a stepped structure in such a way that a thickness of a portion thereof protruding from the upper and lower plates is greater than a thickness of a portion thereof between the upper and lower plates.

10. The coil bobbin for the superconducting magnetic energy storage according to claim 8, wherein the first support plates and the second support plates extend upwards and downwards to be coupled to the corresponding conductive metal bars.

11. The coil bobbin for the superconducting magnetic energy storage according to claim 8, wherein each of the conductive metal bars has a screw hole allowing the connective metal bar to be coupled to the corresponding first and second support plates, the screw hole comprising a vertically-elongated hole.

12. The coil bobbin for the superconducting magnetic energy storage according to claim 8, wherein each of the conductive metal bars is made of anodized aluminum.

13. The coil bobbin for the superconducting magnetic energy storage according to claim 9, wherein the first support plates and the second support plates extend upwards and downwards to be coupled to the corresponding conductive metal bars.

14. The coil bobbin for the superconducting magnetic energy storage according to claim 9, wherein each of the conductive metal bars has a screw hole allowing the connective metal bar to be coupled to the corresponding first and second support plates, the screw hole comprising a vertically-elongated hole.

15. The coil bobbin for the superconducting magnetic energy storage according to claim 9, wherein each of the conductive metal bars is made of anodized aluminum.

16. The coil bobbin for the superconducting magnetic energy storage according to claim 1, further comprising:

wedges respectively provided above and below the center frame.

17. The coil bobbin for the superconducting magnetic energy storage according to claim 1, further comprising:

a joint support provided on an outer surface of each of the first support plates, the joint support guiding the corresponding superconducting coil to an outside and supporting the superconducting coil.

18. The coil bobbin for the superconducting magnetic energy storage according to claim 17, wherein the joint support has a screw hole allowing the joint support to be coupled to the first support plate, the screw hole having an elongated shape.

* * * * *